US 7,376,783 B2

(12) United States Patent
Uchiyama et al.

(10) Patent No.: US 7,376,783 B2
(45) Date of Patent: May 20, 2008

(54) PROCESSOR SYSTEM USING SYNCHRONOUS DYNAMIC MEMORY

(75) Inventors: Kunio Uchiyama, Kodaira (JP); Osamu Nishii, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/598,661

(22) Filed: Nov. 14, 2006

(65) Prior Publication Data

US 2007/0061537 A1 Mar. 15, 2007

Related U.S. Application Data

(63) Continuation of application No. 10/752,569, filed on Jan. 8, 2004, now Pat. No. 7,143,230, which is a continuation of application No. 09/987,145, filed on Nov. 13, 2001, now Pat. No. 6,697,908, which is a continuation of application No. 09/520,834, filed on Mar. 8, 2000, now Pat. No. 6,334,166.

(30) Foreign Application Priority Data

Sep. 18, 1992 (JP) .................................. 4-249190

(51) Int. Cl.
*G06F 12/00* (2006.01)
(52) U.S. Cl. ..................................... 711/105
(58) Field of Classification Search ................ 711/105, 711/167; 713/400
See application file for complete search history.

(56) References Cited

U.S. PATENT DOCUMENTS

| 4,394,753 A | 7/1983 | Penzel |
| 4,513,372 A | 4/1985 | Ziegler et al. |
| 4,727,477 A | 2/1988 | Gavril |
| 4,796,232 A | 1/1989 | House |
| 5,060,145 A | 10/1991 | Scheuneman et al. |
| 5,243,699 A | 9/1993 | Nickolls et al. |
| 5,283,877 A | 2/1994 | Gastinel et al. |
| 5,287,327 A | 2/1994 | Takasugi |

(Continued)

FOREIGN PATENT DOCUMENTS

EP 0245882 11/1987

(Continued)

OTHER PUBLICATIONS

L. Johnson et al., "System Level ASIC Design For Hewlett-Packard's Low Cost PA-RISC Workstations", International Conference of Computer Design Proceedings, pp. 132-133, 1991.

(Continued)

*Primary Examiner*—Hiep T. Nguyen
(74) *Attorney, Agent, or Firm*—Antonelli, Terry, Stout & Kraus, LLP.

(57) ABSTRACT

A chip including: a microprocessor; a control unit coupled to the microprocessor; and interface nodes for coupling a synchronous dynamic memory; wherein the control unit generates command information and the interface nodes output the command information to the synchronous dynamic memory in synchronism with a clock signal, wherein the command information includes a mode register set function which sets mode information to a mode register in the synchronous dynamic memory, and wherein the control unit outputs the mode information to address signal input terminals of the synchronous dynamic memory.

24 Claims, 11 Drawing Sheets

U.S. PATENT DOCUMENTS

| | | | |
|---|---|---|---|
| 5,339,276 A | 8/1994 | Takasugi | |
| 5,339,399 A | 8/1994 | Lee et al. | |
| 5,367,494 A | 11/1994 | Shebanow et al. | |
| 5,371,896 A | 12/1994 | Gove et al. | |
| 5,390,149 A | 2/1995 | Vogley et al. | |
| 5,432,823 A | 7/1995 | Gasbarro et al. | |
| 5,539,911 A | 7/1996 | Nguyen et al. | |
| 5,574,876 A * | 11/1996 | Uchiyama et al. | 711/5 |
| 5,657,481 A | 8/1997 | Farmwald et al. | |
| 6,078,986 A * | 6/2000 | Uchiyama et al. | 711/105 |
| 6,334,166 B1 * | 12/2001 | Uchiyama et al. | 711/105 |
| 6,697,908 B2 * | 2/2004 | Uchiyama et al. | 711/105 |
| 7,143,230 B2 * | 11/2006 | Uchiyama et al. | 711/105 |

FOREIGN PATENT DOCUMENTS

| | | |
|---|---|---|
| EP | 0339224 | 11/1989 |
| EP | 0468480 | 1/1992 |
| JP | 5781660 | 5/1982 |
| JP | 58-166579 | 10/1983 |
| JP | 61220056 | 9/1986 |
| JP | 62-128342 | 6/1987 |
| JP | 62-165247 | 7/1987 |
| JP | 62180398 | 11/1987 |
| JP | 6-476342 | 3/1989 |
| JP | 02029988 | 1/1990 |
| JP | 02-067652 A | 3/1990 |
| JP | 3-15956 | 1/1991 |
| JP | 3-238539 | 10/1991 |

OTHER PUBLICATIONS

Hitachi IC Memory Handbook 2, DRAM, DRAM Module, 389-393, 1991.

Nikkei Electronics, 1992, pp. 143-147.

Speed System Memory by Interleaving DRAM Acceses, 2326 Electronic Design, 37, 1989, No. 21, Cleveland, Ohio.

Nikkei Electronics, No. 553, pp. 143-147, May 11, 1992 (English language translation).

N. Mekhiel, "Speed System Memory By Interleaving DRAM Accesses DRAM Performs at SRAM Speeds To Keep Up With A 33.Mhz 68030 Running In Burst Mode", Electronic Design, vol. 37, No. 21, Oct. 12, 1989, pp. 65-68, 70, 72.

D. Bursky, "80X86-Compatible Family Outperforms Original CPUs", Electronic Design, vol. 39, No. 18, Sep. 26, 1991, pp. 53-56, 61.

Talmudi et al., "A 100MPIS, 64b Superscalar Microprocessor with DSP Enhancements", ISSCC 91, Session 5, Microprocessors, Paper TA 5.6, IEEE, NY, 1991.

* cited by examiner

| RL FIELD | | | CL FIELD | | | WL FIELD | | |
|---|---|---|---|---|---|---|---|---|
| A0 A1 A2 | /RAS DELAY | | A3 A4 | /CAS DELAY | | A5 A6 A7 | /WRAP LENGTH | |
| 0 0 1 | 1 | | 0 1 | 1 | | 0 0 0 | 4 | |
| 0 1 0 | 2 | | 1 0 | 2 | | 0 0 1 | 8 | |
| 0 1 1 | 3 | | 1 1 | 3 | | 1 0 0 | 32 | |
| 1 0 0 | 4 | | | | | 1 1 1 | FULL | |
| 1 0 1 | 5 | | | | | | | |

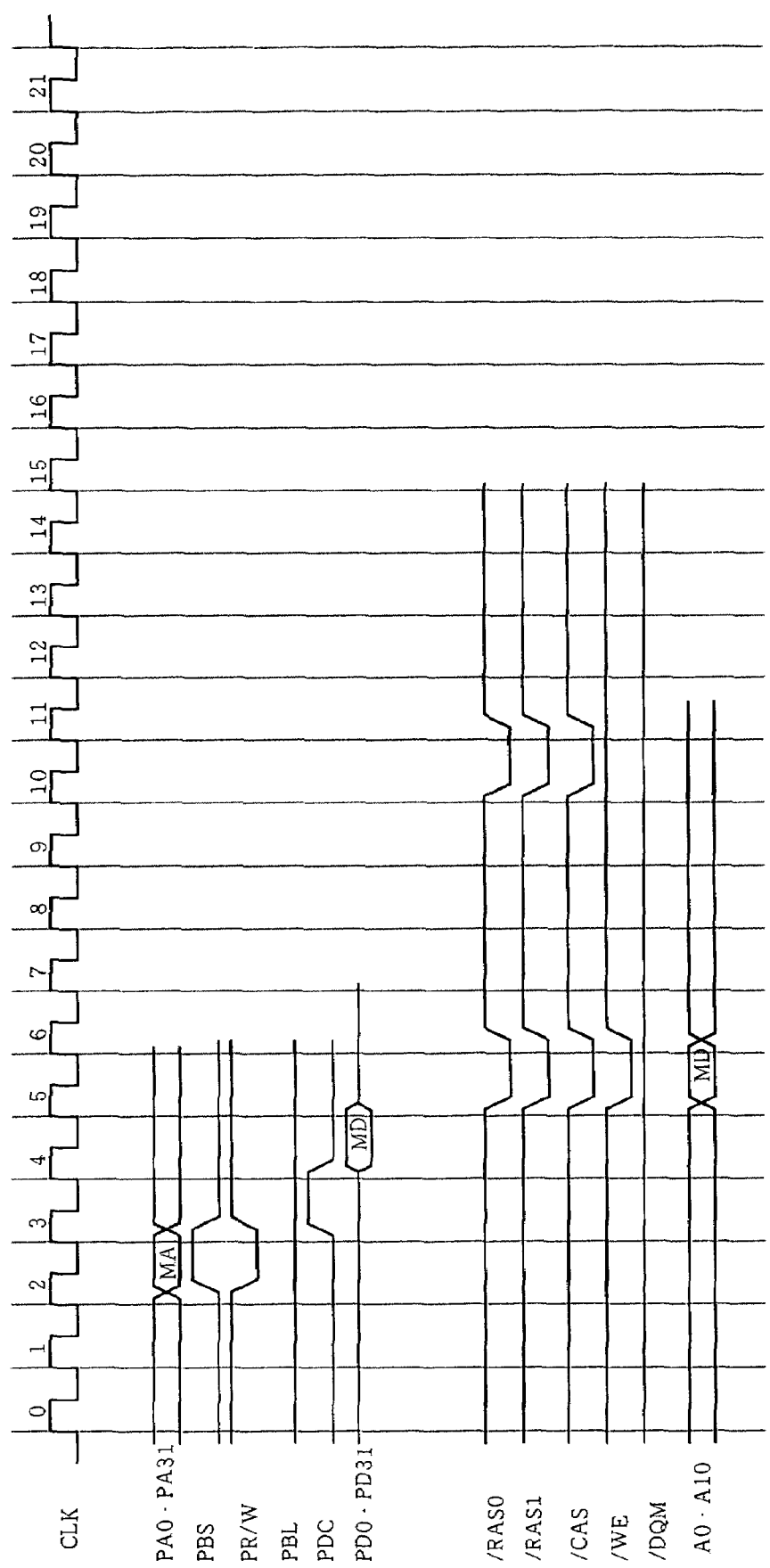

ary of the Invention

PROCESSOR SYSTEM USING SYNCHRONOUS DYNAMIC MEMORY

CROSS REFERENCE TO RELATED APPLICATION

This is a continuation of U.S. application Ser. No. 10/752,569, filed Jan. 8, 2004, now U.S. Pat. No. 7,143,230 which is a continuation of U.S. application Ser. No. 09/987,145 filed Nov. 13, 2001 (now U.S. Pat. No. 6,697,908), which is a continuation of U.S. application Ser. No. 09/520,834, filed Mar. 8, 2000 (now U.S. Patent No. 6,334,166) which relates to copending U.S. application Ser. No. 09/520,726, filed Mar. 8, 2000 (now U.S. Pat. No. 6,260,107), which is a division of U.S. application Ser. No. 08/689,730, filed Aug. 13, 1996 (now U.S. Pat. No. 6,078,986), which is a continuation of U.S. application Ser. No. 08/118,191, filed Sept. 19, 1993 (now U.S. Pat. No. 5,574,876). This application relates to and claims priority from Japanese Patent Application No. 04-249190, filed on Sept. 18, 1992. The entirety of the contents and subject matter of all of the above is incorporated herein by reference.

BACKGROUND OF THE INVENTION

1. Field of the Invention

The present invention relates to a processor system in which a synchronous dynamic memory is used in a storage apparatus for storing data or instructions.

2. Description of the Prior Art

In a conventional processor system, the main storage apparatus for storing data or instructions has been constructed by using a cheap, general purpose dynamic memory. An example of a general architecture of a main storage apparatus of work station using a plurality of dynamic memories can be seen in, for example, L. Johnson et al., "System Level ASIC Design for Hewlett-Packard's Low Cost PA-RISC Workstations", ICCD '91,International Conference on Computer Design, Proceeding, pp. 132-133.

Specifications of such a general purpose dynamic memory are seen in Hitachi IC Memory Handbook 2, "DRAM, DRAM Module" ('91.9), pp. 389-393. As will be seen from the above, the conventional dynamic memory does not have a clock input which serves as an input signal to a chip and during read/write, an internal operation clock was generated in the chip from other control input signals. Further, a mode register for prescribing the operation mode of the dynamic memory was not provided therein and as a consequence, the operation mode of the conventional dynamic memory was fundamentally single. Moreover, the dynamic memory was constructed of a single internal bank.

On the other hand NIKKEI ELECTRONICS, 1992. 5.11 (No. 553), pp. 143-147 introduces, as a dynamic memory being accessible at a twice or 4 times higher speed than before, a synchronous dynamic memory having a plurality of banks and a built-in register which can set the operation mode of these banks (such as delay from /RAS transition or /CAS transition, the number of words accessible sequentially (wrap-length), and the order of addresses of input/output data pieces which are accessed sequentially).

SUMMARY OF THE INVENTION

In the processor system in which the main storage apparatus is constructed of general purpose dynamic memories without clock input as described above, it is impossible to input a clock signal directly to the respective dynamic memory chips and cause each chip to be operated in synchronism with the clock signal.

Accordingly, control signals for the general purpose dynamic memory must be prepared externally of the chip at a timing which meets an AC characteristic of the chip, on the basis of a system clock of the processor system.

Inside the general purpose dynamic memory, on the other hand, an internal operation clock was also generated from the control signal to ensure control of the internal operation. Consequently, in the processor system using the general purpose dynamic memories, the overhead covering the system clock up to the internal operation clock was increased, making it difficult to construct a main storage apparatus capable of operating at a high speed in synchronism with the system clock.

Further, in the processor system in which the main storage apparatus was constructed of general purpose dynamic memories of single mode not incorporating a mode register for prescribing the operation mode of the dynamic memory, the main storage needed to be set up so as to comply with a mode of the general purpose dynamic memory and it was difficult from the standpoint of performance and costs to construct a main storage apparatus optimized for the processor system.

Furthermore, in the processor system in which the main storage apparatus was constructed of general purpose dynamic memories incorporating a single bank, in order for the main storage apparatus to incorporate a plurality of banks, a plurality of general purpose dynamic memories were needed correspondingly and it was difficult from the standpoint of performance and costs to construct a main storage apparatus optimized for the processor system.

Under the circumstances, by using in the main storage apparatus a synchronous dynamic memory having a plurality of banks and a built-in register which can set the operation mode of the dynamic memory, the above problems can be solved.

On the other hand, the conventional processor premises that the main storage apparatus is constructed of general purpose dynamic memories incorporating a single bank. Therefore, if a synchronous dynamic memory having a plurality banks and whose operation mode is set by a built-in register is practically used in the main storage apparatus, then there arises a problem that any of the conventional processor and the synchronous dynamic memory lacks concrete means to realize controlling of access to the plurality of banks and controlling of setting of an operation mode to the built-in register. If the concrete means is arranged in any of the conventional processor and the synchronous dynamic memory, there arises a problem that the processor or the synchronous dynamic memory cannot have compatibility with high generality.

An object of the present invention is to solve the above problems and provide a processor system having a main storage apparatus which can be optimized from the standpoint of performance and costs.

To accomplish the above object, a processor according to a typical embodiment form of the present invention comprises:

a processor (MPU);

a main storage apparatus (MS) accessible by an address from the processor (MPU); and a main storage controller (MC) coupled to the processor and the main storage apparatus, the main storage apparatus (MS) is a memory (501) having a plurality of memory banks (502, 503) and a mode register (505) for determining an operation mode, and the main storage controller (104) includes:

a register control unit (702) for detecting that the address from the processor (MPU) accesses the mode register (505) of the memory (501) and transferring setting information, occurring upon the accessing, to the mode register (505) of the memory (501) in response to a result of detection;

address registers (705a, 705b) for storing at least two consecutive preceding and succeeding access addresses from the processor (MPU);

a bank field comparator (714) for comparing pieces of information about bank fields of the respective two access addresses stored in the address registers, and a memory access control unit (707) for delivering a bank operation start signal (/RAS0, /RAS1) for requesting parallel operations of two accesses corresponding to the two access addresses, in response to an output of the bank field comparator (714) when the bank field information pieces are different from each other. In a preferred embodiment form of the present invention, the processor (MPU) and the main storage controller (104) are individual chips.

In another preferred embodiment form of the present invention, the processor (MPU) and the main storage controller (104) are respectively formed of independent cores inside the same chip.

Further, in a concrete embodiment form of the present invention, when the bank field information pieces of the two access addresses are different from each other during the two preceding and succeeding accesses, during read operation of data by the preceding access from one (502) of the plurality of memory banks (502, 503) of the memory (501), access by the succeeding access to the other (503) of the plurality of memory banks (502, 503) of the memory (501) is initiated.

In a more concrete embodiment form of the present invention, the memory (501) is a synchronous dynamic memory which operates in synchronism with a clock signal applied to its clock input terminal.

Thus, since in accordance with the typical embodiment form of the present invention the means to realize controlling of access to a plurality of banks of the memory (MS) and controlling of setting of an operation mode to the built-in register is arranged in the main storage controller (MC) coupled to the processor (MPU) and the main storage apparatus (MS), the use of the conventional processor of high generality and the conventional memory of high generality can be ensured.

Further, in a preferred embodiment form of the present invention, the processor (MPU) and the main storage controller (104) are respectively formed of separate chips and therefore the use of the conventional processor of high generality and the conventional memory chip of high generality can be ensured by adding the main storage controller (MC).

Further, in another preferred embodiment form of the present invention, the processor (MPU) and the main storage controller (104) are respectively formed of independent cores inside the same chip and therefore the use of the conventional processor core of high generality and the conventional memory chip of high generality can be ensured by adding a core of the main storage controller (MC) into the same chip.

Other objects and features of the present invention will become apparent from embodiments to be described hereinafter.

BRIEF DESCRIPTION OF THE DRAWINGS

FIG. 9 is a time chart of mode setting and refresh cycle.

DESCRIPTION OF THE PREFERRED EMBODIMENTS

An embodiment of the present invention will be described hereunder with reference to the drawings.

Overall Architecture of Processor System

Figure 1:
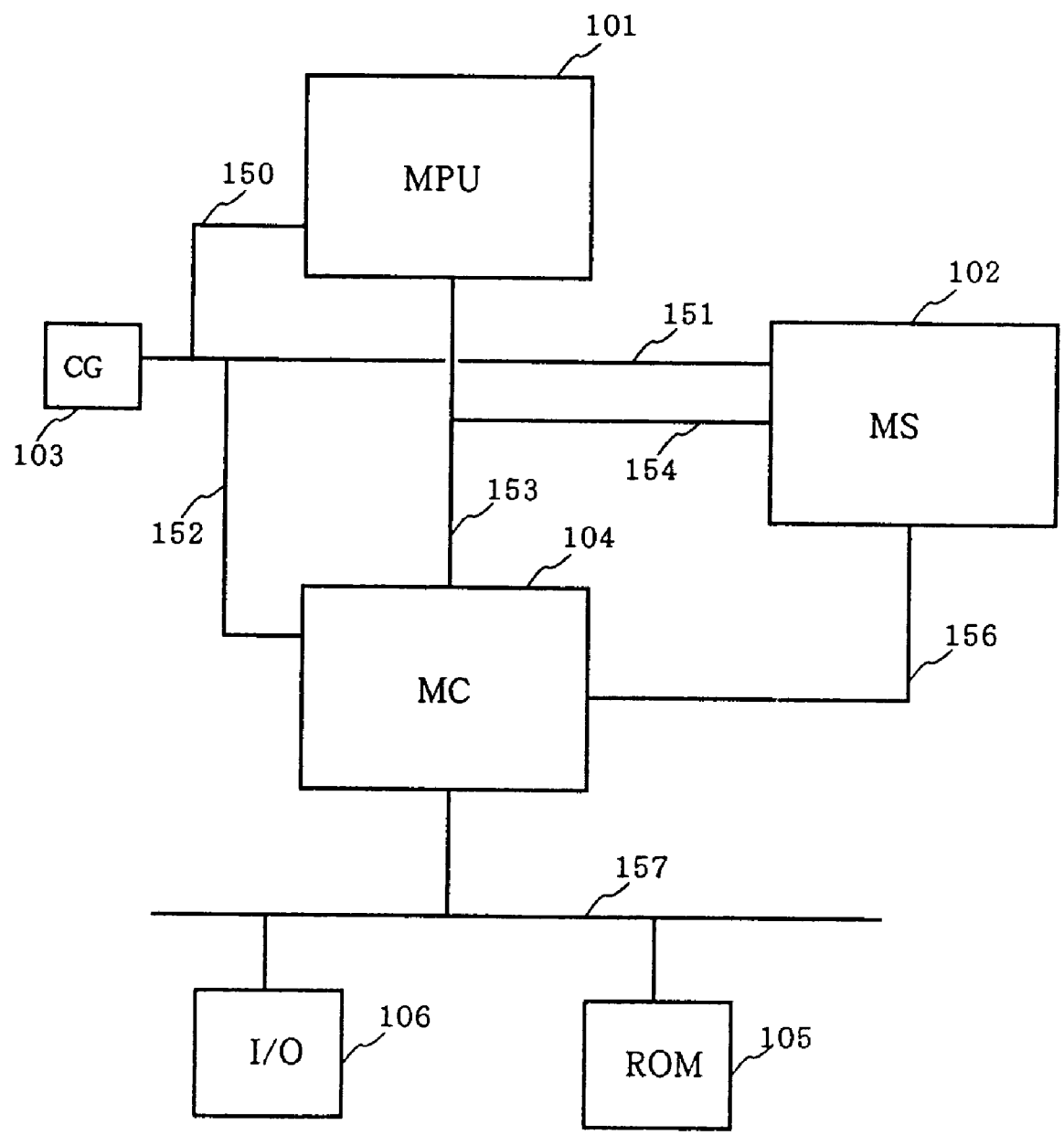
FIG. 1 is a diagram showing an architecture of a processor system according to an embodiment of the present invention.

FIG. 1 is a diagram showing a construction of a processor system.

Reference numeral 101 designates a microprocessor unit (hereinafter abbreviated as MPU) constructed of a single chip.

Reference numeral 102 designates a main storage apparatus (hereinafter abbreviated as MS) which includes a plurality of synchronous dynamic memory chips.

Reference numeral 104 designates a controller for MS 102 which is constructed of a single chip.

Reference numeral 103 designates a clock generator (hereinafter abbreviated as CG) of the processor system. The CG 103 supplies clock signals 150, 151 and 152 to the MPU 101, the MS 102 and the MC 104. These clock signals are synchronous with each other. In the present embodiment, 150, 151 and 152 are clock signals which are in synchronism with each other at the same frequency. However, the relation between 150 and 151 and the relation between 150 and 152 may be allowed to be 1:N (N being integer) or N:1. Denoted by 150, 151 and 152 are signals which are synchronous with each other. Therefore, the individual components of the processor system operate in synchronism with a single system clock.

Reference numeral 153 designates a processor bus through which the MPU 101 and the MC 104 are coupled together and which consists of an address, data and control signals. Of them, a data bus 154 is also coupled to the MS 102. Through this data bus 154, data from the MS 102 is transmitted directly to the MPU 101.

Reference numeral 156 designates addresses and control signal which are supplied from the MC 104 to the synchronous dynamic memory MS 102.

The MC 104 is also coupled to an I/O bus 157. Coupled to this I/O bus 157 are an I/O device 106 and a read only memory (hereinafter abbreviated as ROM) 105 in which initial program loading, operation system boot and a system initializing program are stored.

Internal Architecture of MPU and Processor Bus

Figure 2:
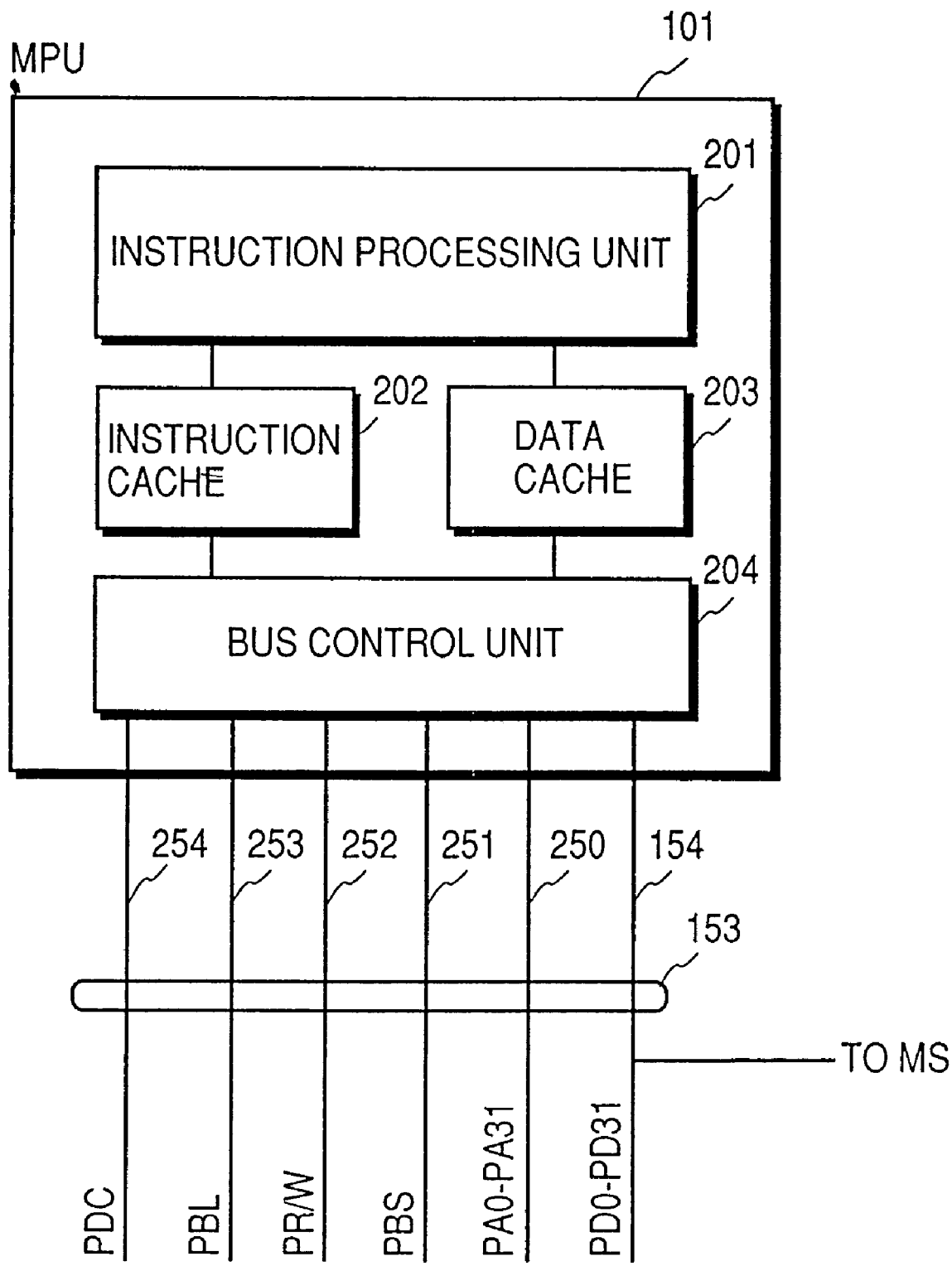
FIG. 2 is a diagram showing an internal architecture of an MPU.

FIG. 2 shows an internal architecture of the MPU 101 and breakdown of the processor bus 153. An instruction processing unit 201 is a unit which decodes an instruction and performs, on the basis of decoded information, such processings as an operation, fetch of data (operand), and store of data and branch. Denoted by 202 is an instruction cache for storing instructions temporarily and supplying the instructions at a high speed in accordance with a request from the instruction processing unit 201. Denoted by 203 is a data cache for storing data temporarily and supplying the data at a high speed in accordance with a request from the instruction processing unit 201. The block length of cache is 16 bytes in both of the instruction cache 202 and the data cache 203. Namely, since the processor bus 153 has a data width of 4 bytes, 16 bytes of a block timed to occurrence of a cache miss is divided by four and transfer from the MS 102 to each division of cache is carried out. Denoted by 204 is a bus control unit for controlling the processor bus. The bus control unit 204 responds to a request from the instruction cache 202, data cache 203 or instruction processing unit 201 to start the processor bus 153 in order that a necessary instruction and necessary data are fetched from the outside or transferred to the outside.

Breakdown of the processor bus 153 is as follows.

PD0-PD31 (154): Data bus of 4-byte width. Input/output signal. The data bus 154 is coupled directly to the MS 102. PD0 is the most significant bit and PD31 is the least significant bit.

PA0-PA31 (250): Address bus of 32-bit width, permitting 4-gigabyte addressing. Output signal. PA0 is the most significant bit and PA31 is the least significant bit.

PBS (251): Bus start signal. Output signal.

PR/W (252): Read/write request signal. During H, read and during L, write. Output signal.

PBL (253): Block transfer request. Output signal.

PDC (254): Transfer ending. Input signal.

Area Assignment in Processor Bus Space

Figure 3:
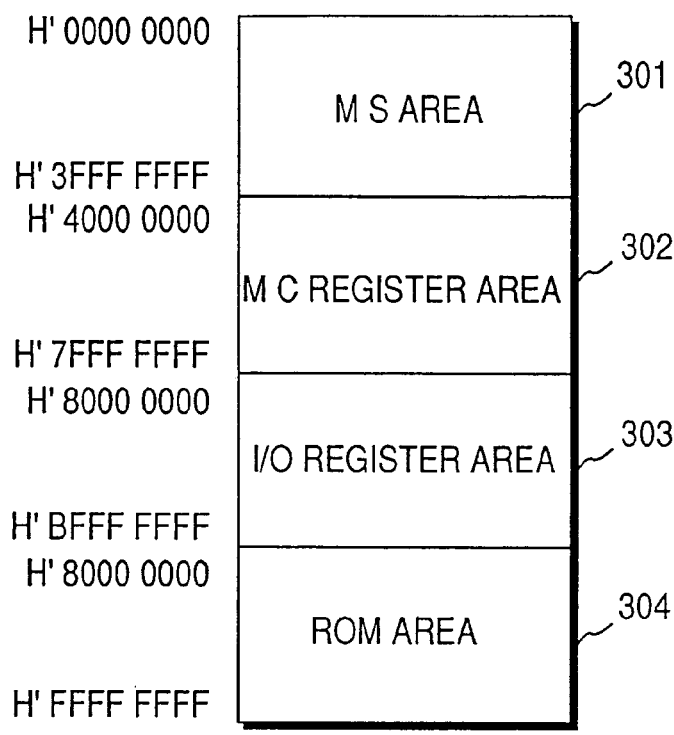
FIG. 3 is a diagram showing area assignment in a processor bus space.

In the present system, a 4-gigabyte space addressable through PA0-PA31 (250) is divided into four areas as shown in FIG. 3 in accordance with upper two bits of addresses.

MS area (301): Area to which the MS 102 is assigned.

MC register area (302): Area to which an internal register of the MC 104 is assigned.

I/O register area (303): Area to which an internal register of the I/O device 106 is assigned.

ROM area (304): Area to which the ROM 105 is assigned.

Internal Assignment in MS Area and MC Register Area

Figure 4:
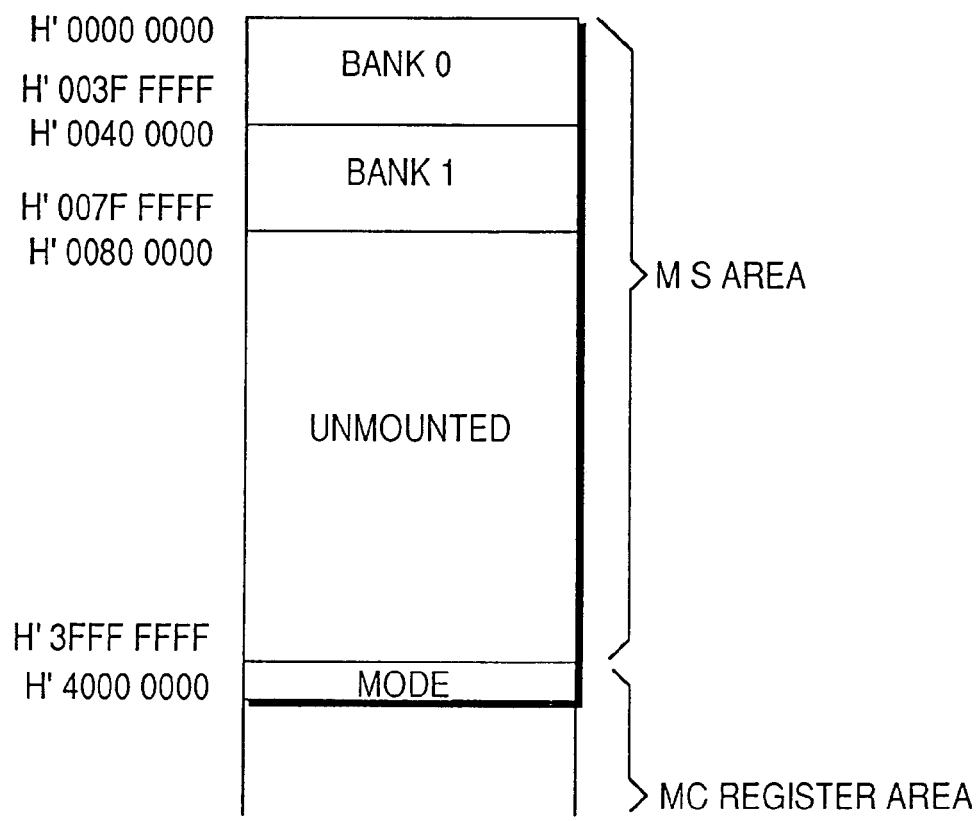
FIG. 4 is an illustrative diagram of an MS area and an MC register area.

FIG. 4 shows internal assignment in the MS area 301 and the MS register area 302. An area between H'00000000 and H'003FFFFF is a sub-area for bank 0. This bank corresponds to one of banks inside the synchronous dynamic memory. An area between H'0040000 and H'007FFFFF is a sub-area for bank 1. This bank corresponds to the other bank inside the synchronous dynamic memory. Assigned to an address H'40000000 of the MC register area 302 is a MODE register of 8-bit length. When the MPU 101 writes a suitable value in this MODE register, the value is set in a mode register inside the synchronous dynamic memory and an operation mode of thereof is determined.

Internal Architecture of Synchronous DRAM

Figure 5A:
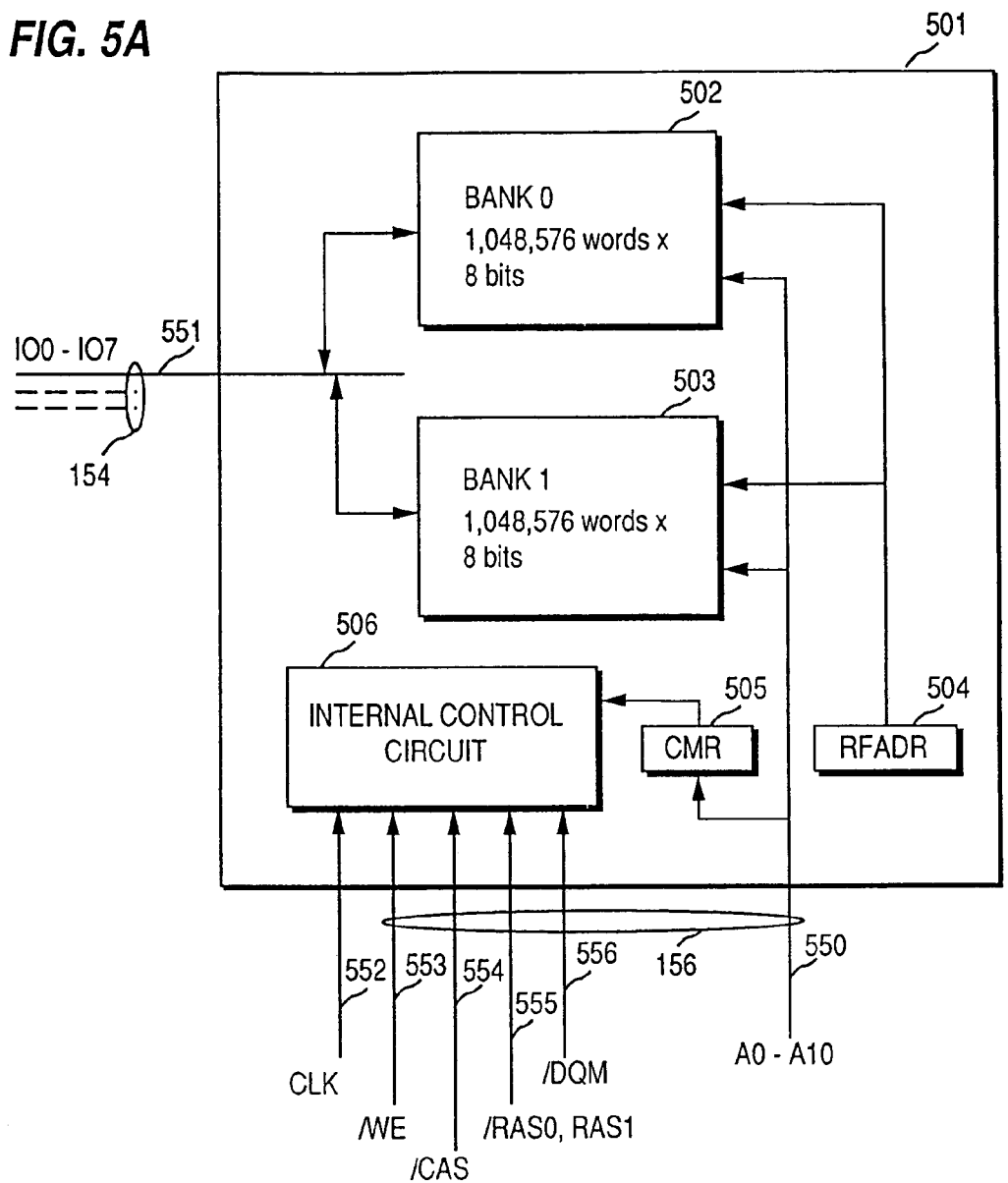
FIGS. 5A and 5B are diagrams showing an internal architecture of a synchronous dynamic memory and a field organization of a command register included in the synchronous dynamic memory.

FIG. 5A shows an internal architecture of a synchronous dynamic memory 501 in a single chip for formation of the MS 102. The MS 102 is comprised of four of the above chips. The memory of this chip has two memory banks which are a bank 0 (502) and a bank 1 (503). Each memory bank is of 1,048,576 words×8 bits. Therefore, the whole chip has a capacity of 16M bits (=8M bytes). Denoted by RFADR 504 is an address counter adapted to prepare a row address for refresh. Denoted by CMR 505 is a mode register for determining an operation mode of the chip 501. Denoted by 506 is an internal control circuit for the chip 501. This circuit responds to control signals from the outside of the chip and a value set in the CMR 505 to prepare an internal operational signal in synchronism with a clock signal inputted externally of the chip.

Interface Signals of Synchronous DRAM

Interface signals of the synchronous dynamic memory are as follows.

A0-A10 (550): Address signal. Input. A row address and a column address are inputted. Used as a row address are 11 bits of A0-A10. Used as a column address are 9 bits of A0-A8. During inputting of a column address, A10 is used for bank designation. During setting of the CMR 505, mode information is inputted through A0-A7.

I/O0-I/O7 (551): Data signal. Input/output. Interface for data signal during read/write.

CLK (552): Clock signal. Input. In synchronism with a rising edge of this signal, a value on an input signal to the chip is fetched internally thereof. Or, in synchronism with a rising edge of this signal, an output is transmitted externally of the chip.

/WE (553): Write enable signal. Input. Asserted (Low level, hereinafter referred to as L) when requesting data write.

/CAS (554): Column address strobe signal. Input. Asserted (L) when supplying a column address.

/RAS0, /RAS1 (555): Row address strobe signal. Input. Asserted (L) when supplying a row address. This signal corresponds to the respective banks and constitutes an operation start signal of each bank.

/DQM (556): Data mask signal. Input. During read, this signal behaves as an enable signal for the output I/O0-I/O7 (551). Unless this signal is asserted (L) during read, the output 551 remains at a high impedance state. During write, this signal behaves as a write enable signal. During write, with this signal asserted (L), data is written actually.

Field Organization of Mode Register

Figure 5B:
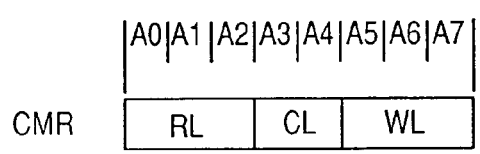

FIG. 5B shows a field organization of the CMR 505 and the contents thereof. An RL field, a CL field and a WL field are respectively associated with addresses defined by bits A0-A2, A3-A4 and A5-A7 and during mode setting, each of the fields fetches values on corresponding address bits. The RL field indicates an /RAS delay. For example, if 100 is set here, data is read out during read operation 4-clock after the /RAS has been asserted. The CL field indicates a /CAS delay. For example, 10 is set here, data is read out during read operation 2-clock after the /CAS has been asserted. The WL field indicates a wrap length. This chip has the function to sequentially read, in synchronism with the clock, data pieces on a row designated by the same row address, beginning with a site designated by a column address. At that time, the column address is wrapped around at a length designated by the WL field. For example, if 000 is designated by the WL field, the wrap length becomes 4 and wraparound of 0-1-2-3, 1-2-3-0, 2-3-0-1 and 3-0-1-2 proceeds.

Architecture of Main Storage

Figure 6:
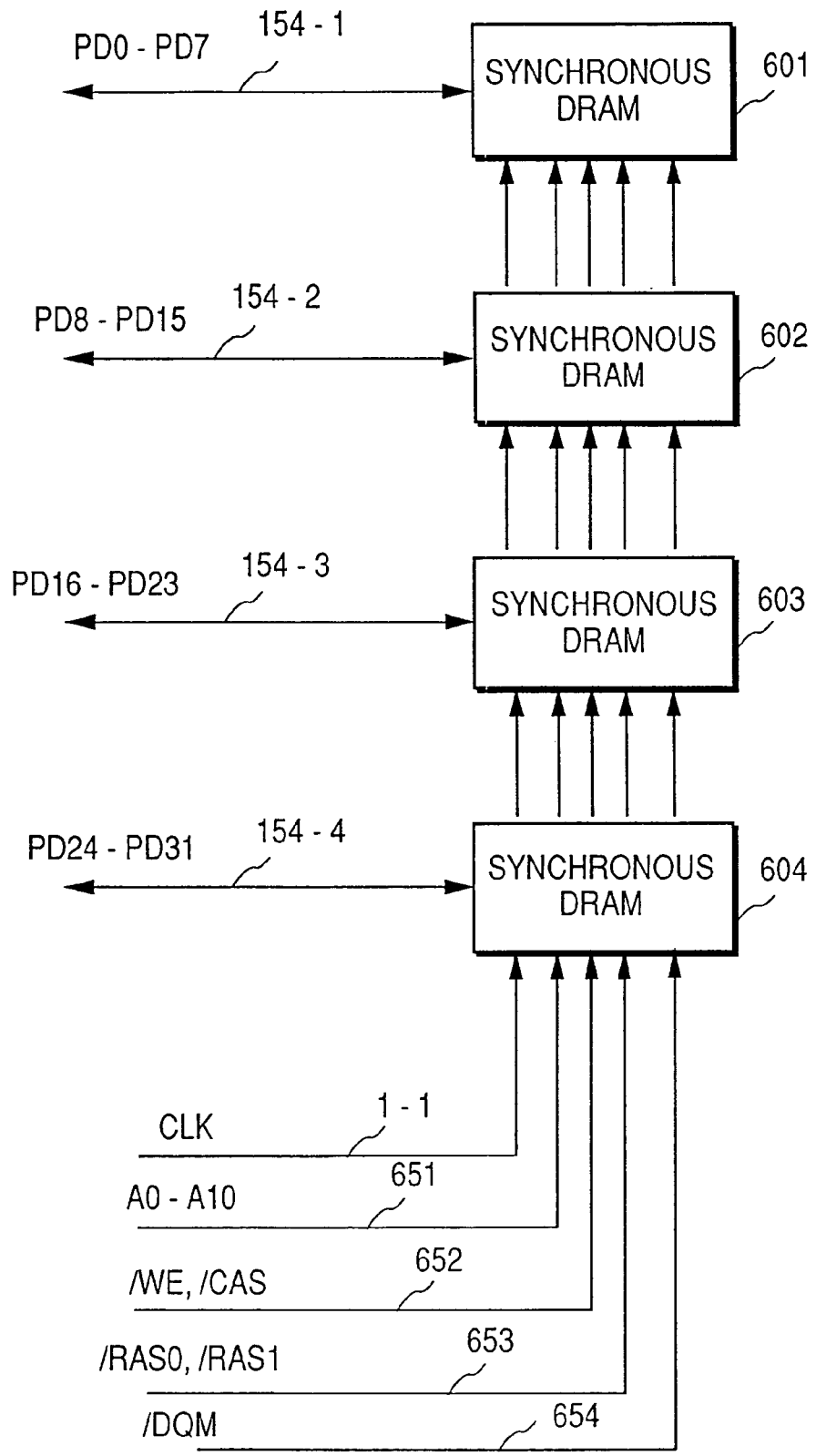
FIG. 6 is a diagram showing an architecture of a main storage apparatus (MS).

FIG. 6 shows an architecture of the MS 102 using four (601, 602, 603 and 604) synchronous dynamic memories 501. 8-bit data signals of individual chips are coupled to respective byte positions of the data bus 154. The clock signal 151 connects to the CLK 552 of each chip, and A0-A10 (651), /WE, /CAS (652), /RAS0, /RAS1 (653) and /DQM (654) connect to corresponding input signals which are common to the respective chips. Denoted by 651, 652, 653 and 654 are output signals from the MC 104.

Figure 7:
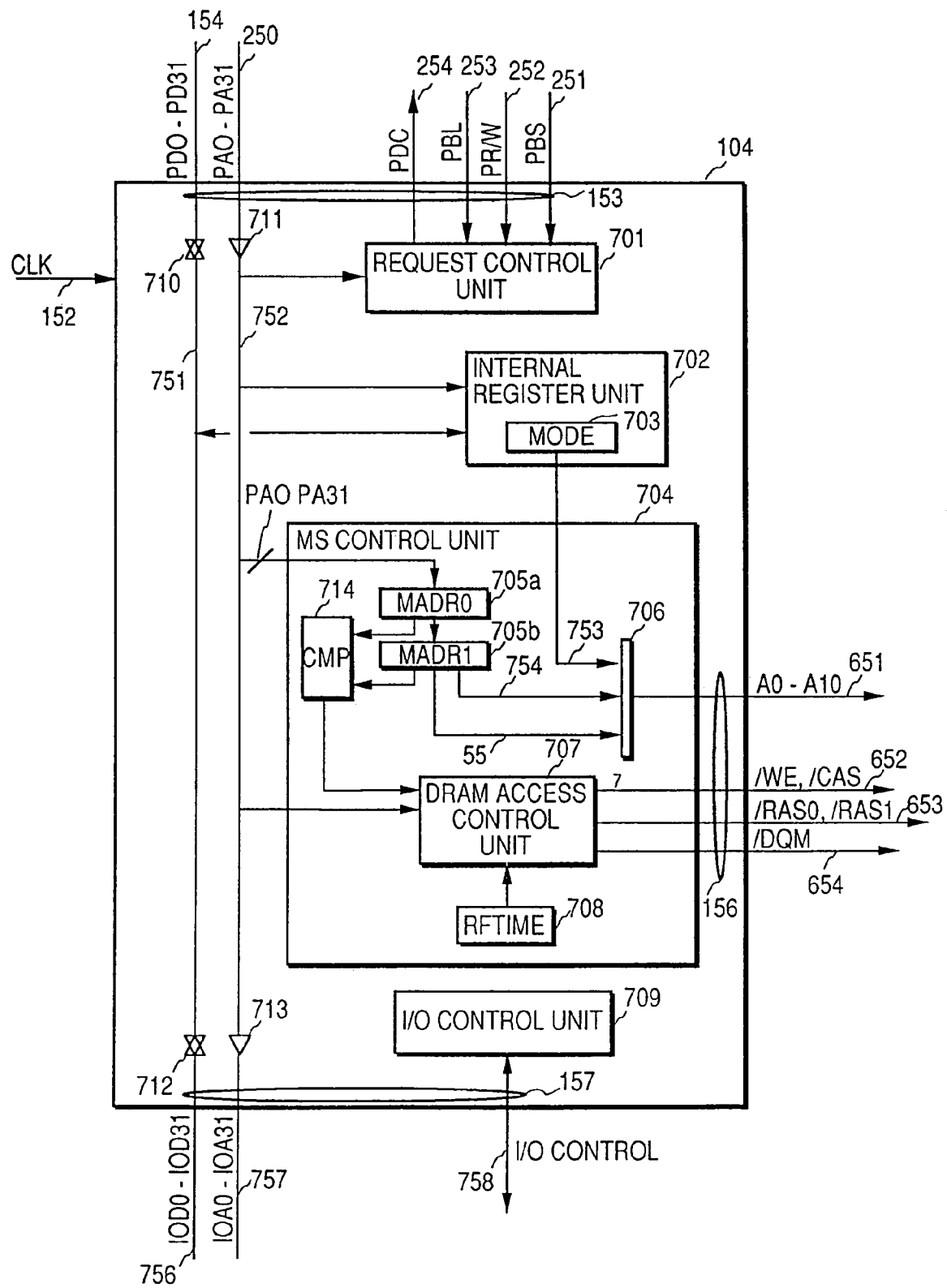
FIG. 7 is a diagram showing an internal architecture of a main storage controller.

Internal Architecture of Main Storage Controller and Bit Assignment to Row, Column and Bank FIG. 7 shows an internal architecture of the MC 104. The internal architecture is comprised of a request control unit 701, an internal register control unit 702, an MS control unit 704 and an I/O control unit 709. The request control unit 701 analyzes upper address two bits of a bus cycle issued from the MPU 101 onto the processor bus 153 to decide which of the MS area 301, MS register area 302, I/O register area 303 and ROM area 304 the bus cycle is destined for and then transfers control to a corresponding control unit.

Provided in the internal register control unit 702 are control registers included in the MC 104. One of them is a MODE register 703 for determining an operation mode of the synchronous dynamic memory. The internal register control unit 702 watches an address signal on the address bus PA0-PA31 (250) to detect that an address from the processor 101 accesses the mode register 505 of the synchronous dynamic memory 501, and responsive to a result of this detection, it transfers setting information (information from the data bus PD0-PD31 (154)) during this accessing to the mode register 505 of the synchronous dynamic memory 501. More particularly, when a value from the MPU 101 is written in this MODE 703, the internal register control unit 702 sends an indication to the MS control unit 704 and sends information written in the MODE 703 to the A0-A7 through a selector 706 to execute a write cycle to the CMR 505 of the synchronous dynamic memory 501.

The MS control unit 704 controls an address signal A0-A10 (651) of a synchronous dynamic memory 501 constituting the MS 102, and a DRAM-access control unit 707 generates control signals /WE, /CAS (652), /RAS0, /RAS1 (653) and /DQM (654).

Denoted by MADR0 (705a) and MADR1 (705b) are registers for holding access addresses of bus cycles issued from the MPU 101 to the MS area. The two registers are constructed in the form of a FIFO (first in first out). An address of a preceding bus cycle is latched in the MADR1 (705b) and an address of a succeeding bus cycle is latched in the MADR0 (705a). As holding of the address of the preceding bus cycle becomes unneeded, the contents of the MADR0 (705a) is shifted to the MADR1 (705b). The contents of 705b is divided into a row address field, a column address field and a bank field.

Figure 8A:
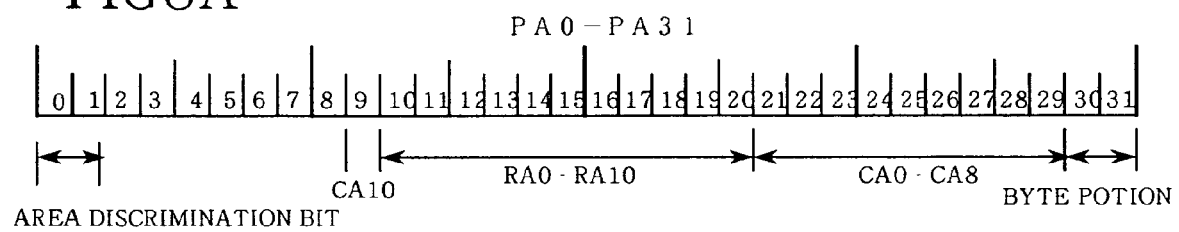
FIGS. 8A and 8B are diagrams showing examples of bit assignment of row, column and bank addresses.

The bit position of each field is shown in FIG. 8A. The 9-th bit represents the bank field CA10, the 10-th to 20-th bits represent the row address field RA0-RA10, and the 21st to 29-th bits represent the column address field CA0-CA8.

When the MS control unit 704 transmits a row address, the RA0-RA10 is transferred to the A0-A10 (651) by means of the selector 706.

When the MS control unit 704 transmits a column address, the CA0-CA8 is transferred to the A0-A8 (651) by means of the selector 706 and at the same time,the bank field CA10 is transferred to the A10 (651).

Denoted by CMP 714 is a comparator for comparing bank fields in the MADR0 (705a) and MADR1 (705b). When a comparison results in coincidence, accesses are destined for the same bank and therefore two cycles of one synchronous dynamic memory cannot be operated in parallel. But when a comparison results in non-coincidence, indicating that accesses are destined for different banks and therefore parallel operations of two cycles are permitted, the DRAM control 707 generates a control signal (/RAS0, /RAS1) which enables the parallel operations. This improves the throughput of the MS 102.

Denoted by RFTIME 708 is a refresh timer. This timer issues a refresh request to the DRAM control 707 at constant time intervals in order to cause it to execute a refresh cycle of the synchronous dynamic memory 501.

The I/O control unit 709 generates an I/O control signal 758 for controlling a bus cycle on the input/output bus 157.

Figure 8B:
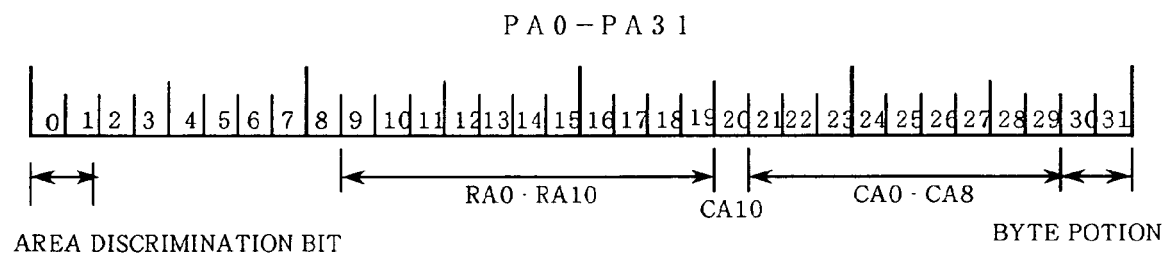

Apart from the present embodiment, bit assignment to a row address field, a column address field and a bank field can be effected as shown in FIG. 8B.

During initial operation of this processor system, an initial operation program is read out of the ROM 105 and executed. In this program, mode setting of the synchronous dynamic memory 501 is first carried out.

During Initial Operation of Processor System

A time chart in this phase is shown in FIG. 9. The MPU 101 issues onto the processor bus 153 an address MA of the MODE register 703 included in the MC 104 and a write bus cycle of a mode setting value MD (clocks 2-4). In response thereto, the MS control unit 704 of the MC 104 asserts /RAS0, /RAS1, /CAS and /WE for the MS 102 and passes a set value to the A0-A7, thereby issuing a mode setting cycle. Through this, the mode setting of all of the synchronous dynamic memories 501 can be accomplished (clock 5). Indicated at a clock 10 is a refresh cycle. This is executed by asserting /RAS0, /RAS1 and /CAS.

Parallel Operations of Two Accesses in Two Different Memory Banks

Figure 10:
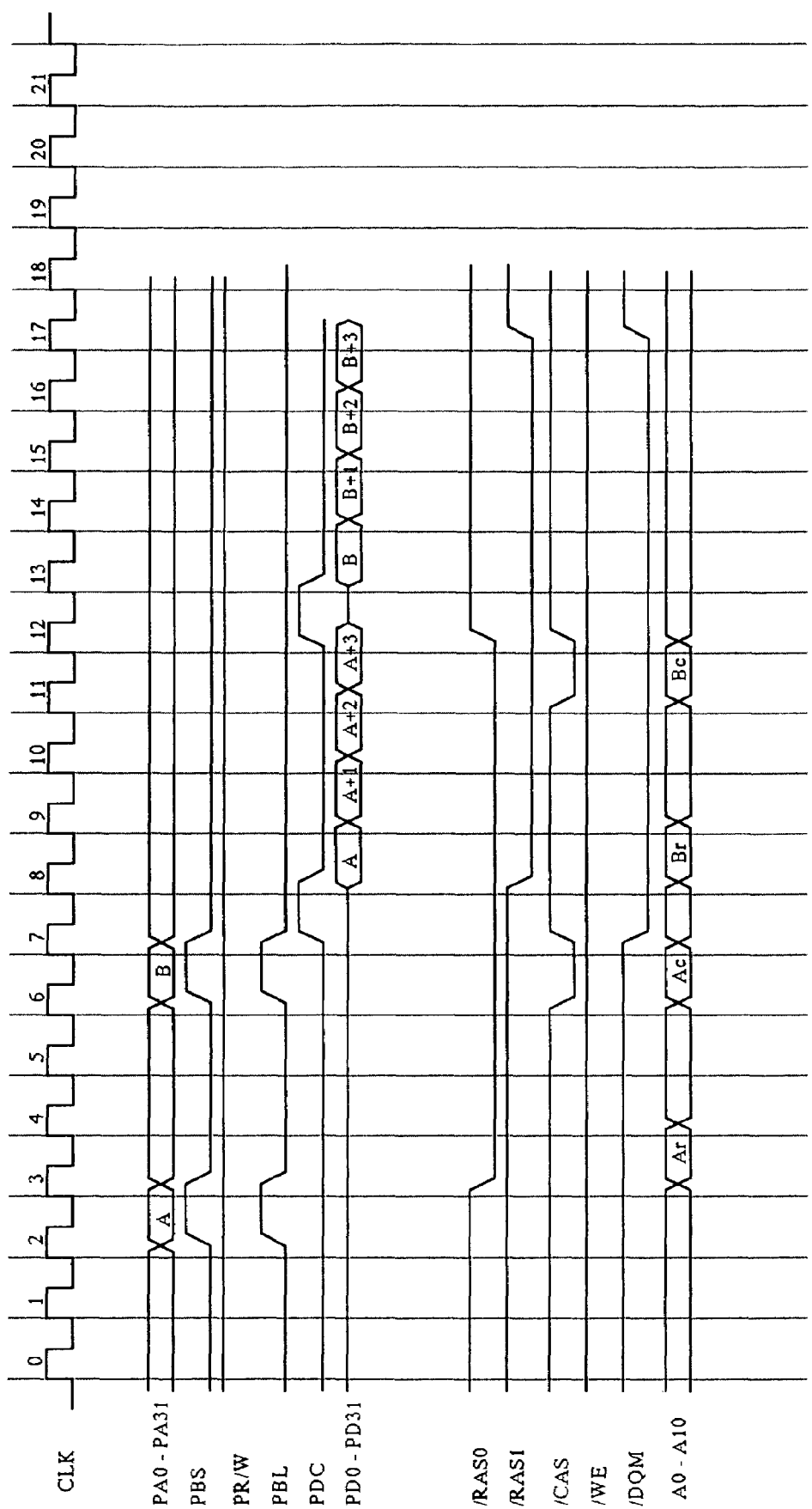
FIG. 10 is a time chart of two read block transfer cycles.

FIG. 10 shows a case of two read block transfer cycles. In this case, /RAS delay is 4 clocks, /CAS delay is 1 clock and the wrap length is 4. At clocks 2 and 6, read block transfer cycle (with PBL asserted) requests are issued from the MPU 101. This issuance is done in the event that, for example, the internal cache of the MPU 101 misses. The preceding block transfer cycle is for the bank 0 and therefore, /RAS0 is asserted for the MS 102 at clock 3 to start the bank 0. Concurrently therewith, a row address Ar is passed through the A0-A10. At clock 6, /CAS is asserted and at the same time, a column address Ac is passed. In order to pass read data to data bus PD0-PD31, /DQM is started to be asserted at clock 7. One block read data of 4 words, that is, A, A+1, A+2 and A+3 are sequentially read in synchronism with clocks 8, 9, 10 and 11. During read-out of this one block, start of a succeeding bus cycle (access to the bank 1) is initiated (/RAS1 is asserted at clock 8) and data for this, that is, B, B+1, B+2 and B+3 are sequentially read during 4 clocks which begin with clock 13. By asserting PDC, the MPU 101 can be informed of arrival of read data.

Figure 11:
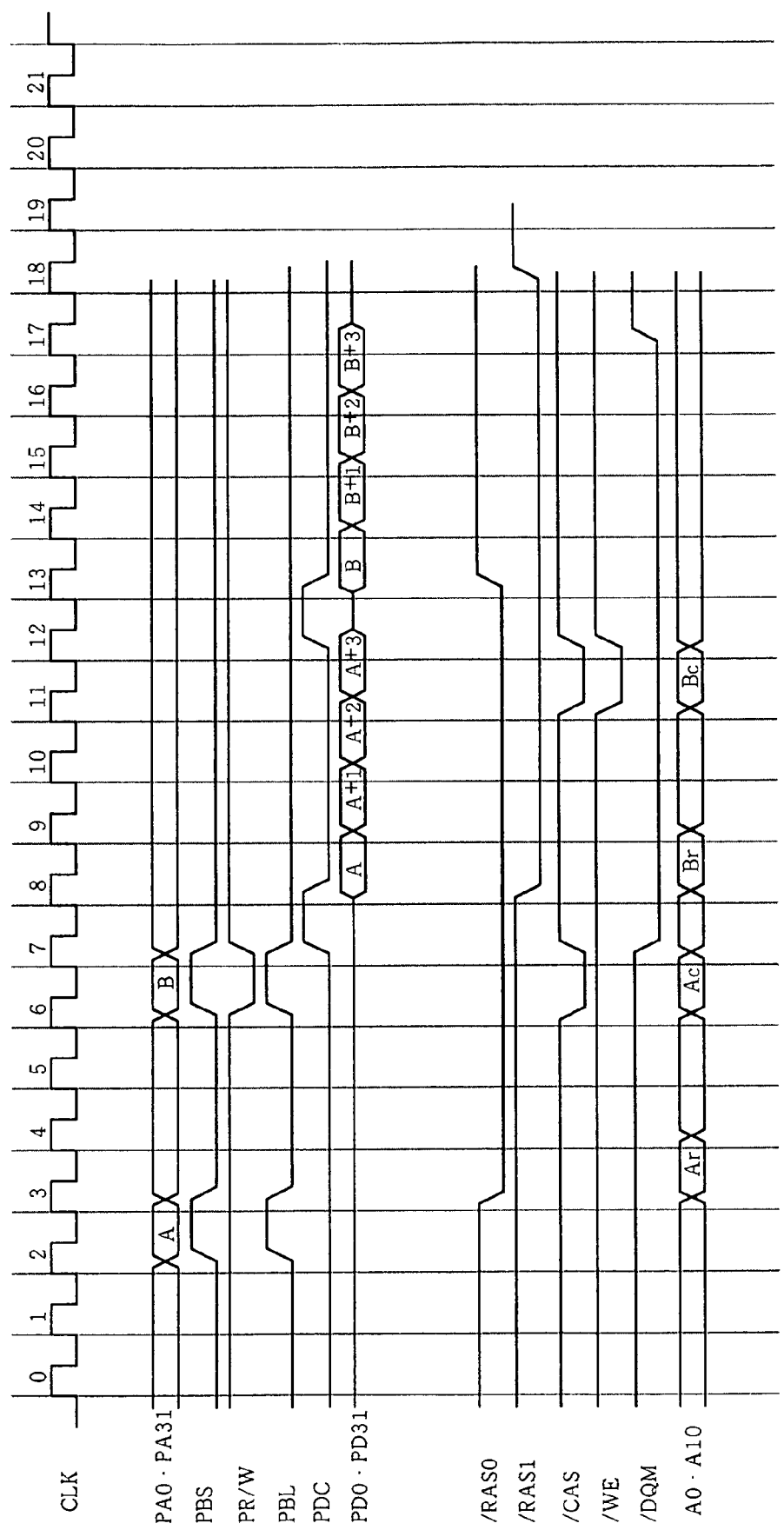
FIG. 11 is a time chart of a read block transfer cycle/write block transfer cycle.

FIG. 11 shows a case where after a read block transfer cycle of data A, A+1, A+2 and A+3 a write block transfer cycle of data B, B+1, B+2 and B+3 is issued. In this case, /RAS delay is 4 clocks, /CAS delay is 1 clock and the wrap length is 4. At clock 6, a write block transfer cycle (PR/WL=L) request is issued from the MPU 101. This issuance is done in the event that, for example, the internal cache of the MPU 101 misses. The preceding block transfer cycle is for the bank 0 and therefore, /RAS0 is asserted for the MS 102 at clock 3 to start the bank 0. Concurrently therewith, a row address Ar is passed through the A0-A10. At clock 6, /CAS is asserted and at the same time, a column address Ac is passed. In order to pass read data to data bus PD0-PD31, /DQM is started to be asserted at clock 7. The read data is sequentially read in synchronism with clocks 8, 9, 10 and 11. During read-out of this data, start of a succeeding bus cycle (access to the bank 1) is initiated (/RAS1 is asserted at clock 8) and when PDC is asserted at clock 12, the MPU 101 sequentially delivers data onto onto the data bus PD0-PD31 during 4 clocks which begin with clock 13.

Since the parallel operations of the two banks can be permitted as shown in FIGS. 10 and 11, the main storage apparatus of high throughput can be constructed.

OTHER EMBODIMENTS

The present invention has been described by way of example but the invention is in no way limited to the foregoing specified embodiments and may obviously be modified in various ways within the scope of the fundamental technical idea of the present invention. For example, the following embodiment can be adopted in accordance with the present invention.

Figure 12:
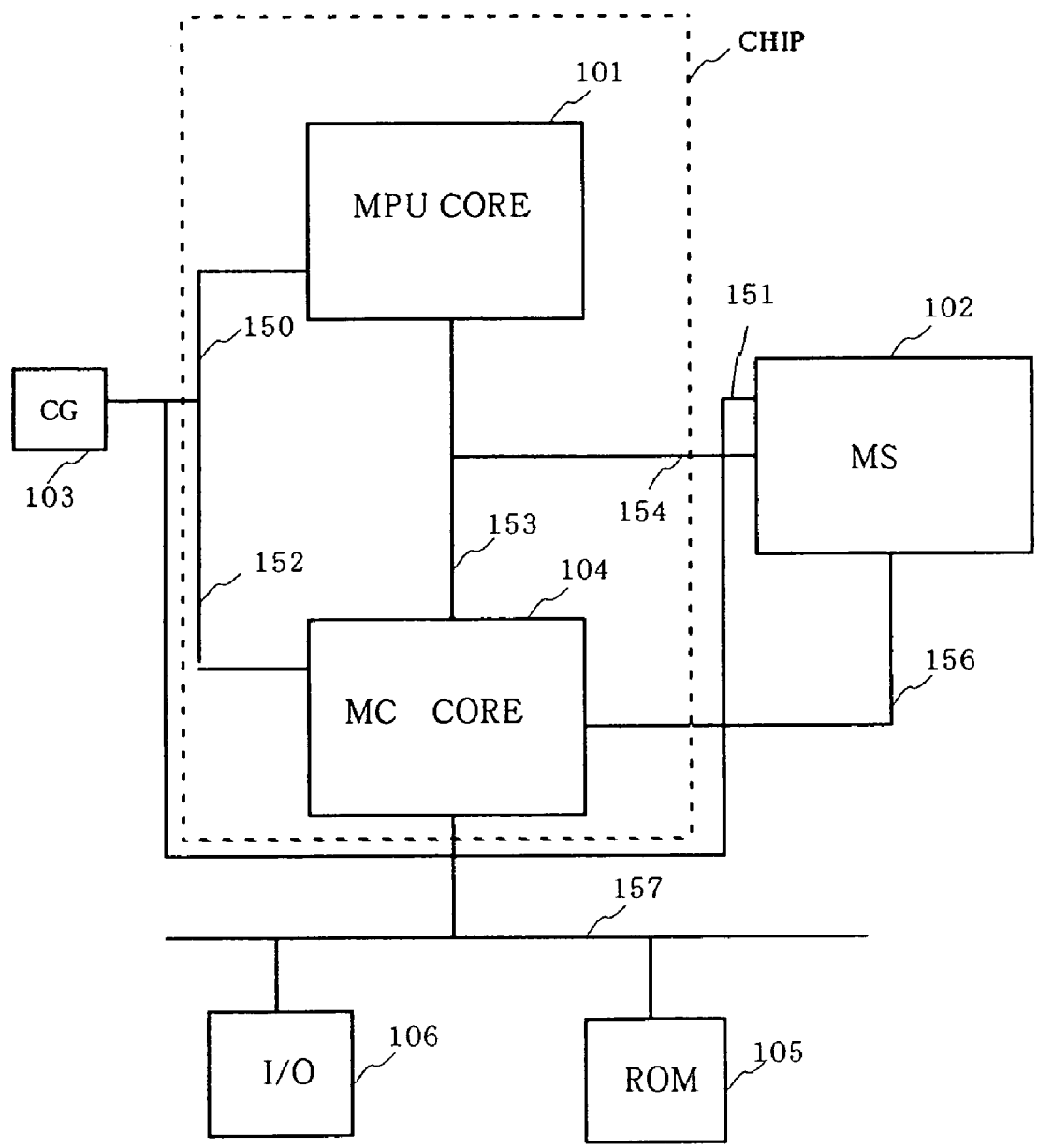
FIG. 12 is a diagram showing an architecture of a processor system according to another embodiment of the present invention.

FIG. 12 is a diagram showing an architecture of a processor system according to another embodiment of the invention and this embodiment differs from the embodiment of FIG. 1 in that a processor (MPU) and a main storage controller (104) are respectively formed of independent cores inside the same chip. Accordingly, by adding the core of the main storage controller (MC) into the same chip, the use of the conventional processor core of highly generality and the conventional memory chip of high generality can be ensured.

As has been described, according to the typical embodiment form of the present invention, means to realize controlling of access to a plurality of banks of the memory (MS) and controlling of setting of an operation mode to the built-in register is arranged in the main storage controller (MC) coupled to the processor (MPU) and the main storage apparatus (MS) and therefore the use of the conventional processor of high generality and the conventional memory of thigh generality can be ensured.

What is claimed is:

1. A data processor formed on a single chip comprising:
   first address terminals used for multiplexed row and column address to a synchronous memory, the synchronous memory being operative based on a clock signal inputted from an outside of the synchronous memory;
   a processor core;
   a main storage controller core coupled with the address terminals, the main storage controller controlling the synchronous memory; and
   a first mode register used to write to a second mode register that resides within the synchronous memory,
   wherein the first mode register is assigned to a predetermined address in an address space of the processor core, to be written a mode register value,
   wherein the mode register value stored in the first mode register is outputted from the first address terminals to the synchronous memory.

2. The data processor according to claim 1,
   wherein the data processor outputs the mode register value in an initial sequence of the synchronous memory.

3. The data processor according to claim 1, comprising:
   an address bus and a data bus coupling between the processor core and the main storage controller core,
   wherein the address signal is transferred to the first mode register via the address bus, and
   wherein the data signal is transferred to the first mode register via the data bus.

4. The data processor according to claim 1, comprising:
   a selector outputting the mode register value or the multiplexed row and column address selectively to the address terminals.

5. The data processor according to claim 1,
   wherein the processor core outputs a row address, and column address in parallel as an access address signal to the main storage controller core, and
   wherein the main storage controller core outputs the row address and the column address signal from the address terminals, respectively.

6. The data processor according to claim 1,
   wherein the mode register value includes a value corresponding to a /CAS delay of the synchronous memory.

7. The data processor according to claim 1, wherein the synchronous memory is a synchronous dynamic memory.

8. The data processor according to claim 7,
   wherein the synchronous memory has second address terminals,
   wherein the mode register value is outputted to the second address terminals of the synchronous memory.

9. A data processor formed on a single chip comprising:
   first address terminals outputting for address signals to a synchronous memory, the synchronous memory being operative based on a clock signal inputted from an outside of the synchronous memory;
   a processor core;
   a main storage controller core coupled with the address terminals, the main storage controller controlling the synchronous memory; and
   a first mode register set a value loaded into a second mode register of the synchronous memory,
   wherein the first mode register is assigned to a predetermined address in an address space of the processor core, to be set the value loaded into the second mode register of the synchronous memory,
   wherein the mode register value stored in the first mode register is outputted from the first address terminals to the synchronous memory.

10. The data processor according to claim 9,
    wherein the data processor outputs the value loaded into the second mode register of the synchronous memory in an initial sequence of the synchronous memory.

11. The data processor according to claim 9, comprising:
    an address bus and a data bus coupling between the processor core and the main storage controller core,
    wherein an address signal is transferred to the first mode register via the address bus, and
    wherein a data signal is transferred to the first mode register via the data bus.

12. The data processor according to claim 9, comprising:
    a selector outputting the value loaded into the second mode register of the synchronous memory or the address signals selectively to the address terminals.

13. The data processor according to claim 9,
wherein the processor core outputs a row address and column address in parallel as an access address signal to the main storage controller core, and
wherein the main storage controller core outputs the row address and the column address signal from the address terminals, respectively.

14. The data processor according to claim 9,
wherein the value loaded into the second mode register of the synchronous memory includes a value corresponding to a /CAS delay of the synchronous memory.

15. The data processor according to claim 9,
wherein the synchronous memory is a synchronous dynamic memory.

16. The data processor according to claim 15,
wherein the synchronous memory has second address terminals,
wherein the value loaded into the second mode register of the synchronous memory is outputted to the second address terminals of the synchronous memory.

17. A data processor formed on a single chip, used for coupling with a synchronous dynamic memory chip having a first mode register and first address terminals, and being operative base on a clock signal inputted from outside, the data processor comprising:
a processor core having an instruction cache and a data cache;
a controller core, coupled to the processor core, having a second mode register used to write to the first mode register; and
second address terminals coupled to the controller core,
wherein the controller outputs a write enable signal (/WE), a column address strobe signal (/CAS) and a row address strobe signal (/RAS) to the synchronous dynamic memory chip,
wherein the second mode register is assigned to a predetermined address in an address space of the processor core, to be written a mode register value including a value corresponding to a /CAS delay of the synchronous dynamic memory,
wherein the mode register value stored in the second register is outputted from the second address terminals to the first address terminals of the synchronous dynamic memory chip,
wherein the second address terminals are used for multiplexed row and column address to the synchronous dynamic memory chip.

18. The data processor according to claim 17,
wherein the clock signal inputted from outside of the data processor chip.

19. A data processor formed on a single chip, used for coupling with a synchronous dynamic memory chip having a first mode register, the data processor comprising:
a processor core;
a controller core, coupled to the processor core, having a second mode register used to write to the first mode register; and
address terminals coupled to the controller core,
wherein the controller outputs a write enable signal (/WE), a column address strobe signal (/CAS) and a row address strobe signal (/RAS) to the synchronous dynamic memory chip,
wherein the second mode register is assigned to a predetermined address in an address space of the processor core, to be written a mode register value including a value corresponding to a /CAS delay of the synchronous dynamic memory,
wherein the mode register value stored in the second register is outputted from the address terminals in an initial sequence of the synchronous dynamic memory chip,
wherein the address terminals are used for multiplexed row and column address to the synchronous dynamic memory chip.

20. A data processor formed on a single chip, used for coupling with a synchronous dynamic memory chip having a first mode register and first address terminals, the data processor comprising:
a processor core;
a controller core, coupled to the processor core via hut, having a second mode register used to write to the first mode register; and
second address terminals coupled to the controller core,
wherein the controller outputs a write enable signal (/WE), a column address strobe signal (/CAS) and a row address strobe signal (/RAS) to the synchronous dynamic memory chip,
wherein the second mode register is assigned to a predetermined address in an address space of the processor core, to be written a mode register value including a value corresponding to a /CAS delay of the synchronous dynamic memory,
wherein the processor core writes the mode register value into the second mode register via the bus,
wherein the mode register value stored in the second register is outputted from the second address terminals to the first address terminals of the synchronous dynamic memory chip,
wherein the second address terminals are used for multiplexed row and column address to the synchronous dynamic memory chip.

21. A data processor formed on a single chip, used for coupling with a synchronous dynamic memory chip having a first mode register and first address terminals, the data processor comprising:
a processor core;
a controller core, coupled to the processor core, having a second mode register and a selector; and
second address terminals coupled to the controller core,
wherein the controller outputs a write enable signal (/WE), a column address strobe signal (/CAS) and a row address strobe signal (/RAS) to the synchronous dynamic memory chip,
wherein the second mode register is assigned to a predetermined address in an address space of the processor core, to be written a mode register value including a value corresponding to a /CAS delay of the synchronous dynamic memory,
wherein the mode register value stored in the second register is outputted from the second address terminals to the first address terminals of the synchronous dynamic memory chip,
wherein the selector outputs the mode register value, and multiplexed row and column address selectively to the first address terminals.

22. A data processor formed on a single chip, used for coupling with a synchronous dynamic memory chip having a first mode register and first address terminals, the data processor comprising:
a processor core;
a controller core, coupled to the processor core, having a second mode register used to write to the first mode register; and
second address terminals coupled to the controller core, wherein the second mode register is assigned to a predetermined address in an address space of the processor core, to be written a mode register value including a value corresponding to a /CAS delay of the synchronous dynamic memory, wherein the mode register value stored in the second register is outputted from the second address terminals to the first address terminals of the synchronous dynamic memory chip, wherein the processor core outputs a row address and column address in parallel as access address signal to the controller core, and wherein the controller core outputs the row address and column address signal from the second address terminals, selectively, and outputs a write enable signal (/WE), a column address strobe signal (/CAS) and a row address strobe signal (/RAS) to the synchronous dynamic memory chip.

23. A data processor formed on a single chip, used for coupling with a synchronous dynamic memory chip having a first mode register and first address terminals, and being operative base on a clock signal inputted from outside, the data processor comprising:

a processor core having an instruction cache and a data cache;

a controller core, coupled to the processor core, having a second mode register set a value, loaded into the first mode register; and second address terminals coupled to the controller core, wherein the controller outputs a write enable signal (/WE), a column address strobe signal (/CAS) and a row address strobe signal (/RAS) to the synchronous dynamic memory chip, wherein the second mode register is assigned a predetermined address in address space of the processor core, to be written a mode register value including a value corresponding to a /CAS delay of the synchronous dynamic memory, wherein the mode register value stored in the second register is outputted from the second address terminals to the first address terminals of the synchronous dynamic memory chip, wherein address signals are outputted from the second address terminals to the synchronous dynamic memory chip.

24. The date processor according to claim 23, wherein the clock signal inputted from outside of the data processor chip.

* * * * *

UNITED STATES PATENT AND TRADEMARK OFFICE
CERTIFICATE OF CORRECTION

PATENT NO. : 7,376,783 B2  Page 1 of 1
APPLICATION NO. : 11/598661
DATED : May 20, 2008
INVENTOR(S) : Uchiyama et al.

It is certified that error appears in the above-identified patent and that said Letters Patent is hereby corrected as shown below:

On the title page:

Item (*), should read:

(*) Notice:  Subject to any disclaimer, the term of this
Patent is extended or adjusted under 35
U.S.C. 154(b) by 0 days.

This Patent is subject to a terminal disclaimer.

Item (63), should read:

(*) Continuation of application No. 10/752,569, filed on Jan. 8, 2004, now Pat. No. 7,143,230, which is a continuation of application No. 09/987,145, filed on Nov. 13, 2001, now Pat. No. 6,697,908, which is a continuation of application No. 09/520,834, filed on Mar. 8, 2000, now Pat. No. 6,334,166, which is a division of application No. 08/689,730, filed on Aug. 13, 1996, which is a continuation of application No. 08/118,191, filed on Sep. 9, 1993, now Pat. No. 5,574,876.

Signed and Sealed this

Twenty-sixth Day of May, 2009

JOHN DOLL
*Acting Director of the United States Patent and Trademark Office*